Jan. 17, 1967 N. KLEIN 3,298,229

TEMPERATURE DETECTOR

Filed May 29, 1964

INVENTOR.
NICHOLAS KLEIN

BY

OSTROLENK, FABER, GERB & SOFFEN

ATTORNEYS

United States Patent Office 3,298,229
Patented Jan. 17, 1967

3,298,229

TEMPERATURE DETECTOR

Nicholas Klein, Haifa, Israel, assignor to Technion Research and Development Foundation, Ltd., Haifa, Israel Filed May 29, 1964, Ser. No. 371,192
4 Claims. (Cl. 73—204)

This invention relates to radiation indicators, and more specifically relates to a novel semiconductor device having a junction therein close to its surface which will change its forward voltage at constant current in accordance with the radiant energy applied to the junction.

Semiconductor materials such as germanium and silicon have the well-known characteristic wherein at constant voltage the forward current will be an exponential function of temperature. Such devices have been commonly used for bolometers which take advantage of this exponential behavior.

The present invention is to provide a semiconductor device for temperature measurement purposes which has a P-N junction therein and which takes advantage of a temperature-sensitive characteristic of a semiconductor junction. Namely, when forward current through a junction is held constant, the forward voltage across the junction will decrease linearly with temperature. The magnitude of this decrease is of the order of a few millivolts per degree centigrade for commonly available silicon diodes with this coefficient being substantially constant over large ranges of temperature. By way of example, for a temperature increase of 100° C., this temperature coefficient would increase by the order of 1 to 2%.

The specific temperature coefficient will depend logarithmically upon the impurity concentration within the semiconductor device, the current density of the device, and the temperature. Typical values of this coefficient at room temperature are 0.002 volt per degree centigrade for an impurity concentration of $10^{17}$ per $cm.^3$ and a current density of 0.1 ampere per $cm.^2$. Where the impurity concentration is decreased to the $10^{13}$ per $cm.^3$, and the current density is changed to $10^{-5}$ amperes per $cm.^2$, then the coefficient will be 0.0036 volt per degree centigrade.

The principle of the present invention is to utilize this property of semiconductor devices having junctions therein for temperature measurement whereby the devices may be useful as infrared detectors, flow velocity measuring devices, or other similar applications.

Accordingly, a primary object of this invention is to provide a novel temperature measuring device.

Another object of this invention is to provide a novel temperature measuring device which is completely static.

A further object of this invention is to provide a novel highly sensitive temperature measuring device which is rugged in construction.

Yet a further object of this invention is to utilize the forward voltage characteristics of a semiconductor junction at constant current for temperature measurement purposes.

These and other objects of this invention will become apparent from the following description when taken in connection with the drawings, in which.

Figure 1:
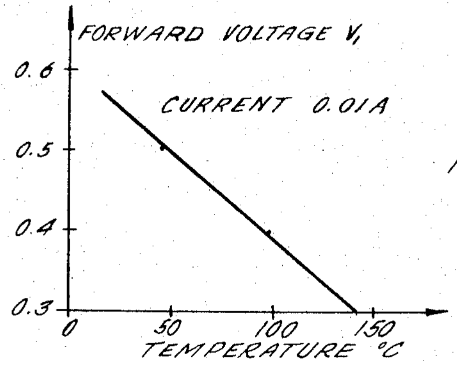
FIGURE 1 shows the forward voltage-temperature characteristics of a semiconductor junction for constant current.

Referring first to FIGURE 1, I have illustrated therein a typical semiconductor junction characteristic wherein the forward voltage V measured across the junction will vary substantially linearly as the temperature changes. A current of 0.01 ampere was used in the measurement of the curve of FIGURE 1, this current being held constant throughout the experiment.

FIGURES 2 through 5 illustrate a first embodiment of the invention utilizing the characteristics of FIGURE 1 for an infrared detector device.

Figure 3:
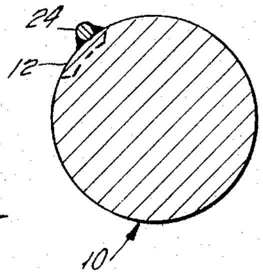
FIGURE 3 is a cross-sectional view of the wafer of FIGURE 1 taken across the lines 3—3 in FIGURE 2.
Figure 2:
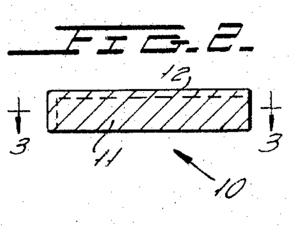
FIGURE 2 shows a semiconductor wafer having a junction therein for use with the present invention in side cross-sectional view.

Referring first to FIGURES 2 and 3, I have illustrated therein a semiconductor wafer 10 which could, for example, be of monocrystalline silicon prepared in any desired manner, and which has an N-type body 11. Clearly the process could start with a P-type body. A P-type region 12 is then diffused into the upper surface of wafer 10, as illustrated by the dotted lines, with a portion of this P-type region extending over the edge of the wafer, as shown particularly in FIGURE 3. As will be seen more fully hereinafter, this will provide a simple means for reception of a lead which will not interfere with the upper surface of the device.

Where the device is to be used as an infrared detector, this diffusion is preferably carried out to a depth of the order of 1 micron.

Figure 4:
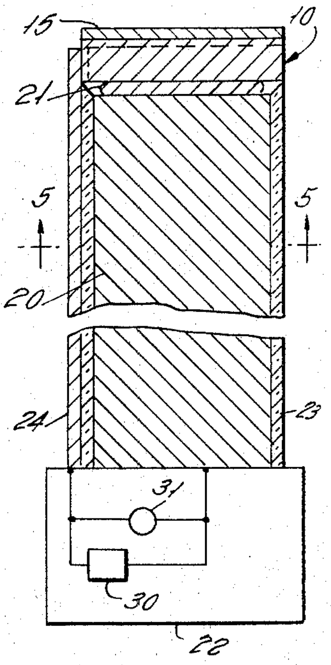
FIGURE 4 shows a cross-sectional view of the assembled device of the present invention for infrared measurement purposes.

As is then shown in FIGURE 4, the upper P-type surface of the wafer 10 is covered with an evaporated layer of gold black 15 which may have a thickness of the order of one micron. The gold black layer 15 insures very good thermal coupling between the layer 15 and the wafer 10.

The purpose of the layer 15 is to absorb at least substantially all of the short infrared and visible radiation falling on the surface of the detector. By absorbing short infrared and visible radiation completely, the diode is prevented from acting as a photovoltaic cell. Thus, while gold black serves this purpose quite well, any other suitable infrared and visible radiation absorption material could be utilized.

The purpose of the very thin gold black layer and the very small depth of the P-type layer is to insure that the junction temperature will faithfully, within the order of a microsecond, follow the temperature changes caused by the infrared radiation. Note that where silicon is used for the wafer, the relatively high thermal conductivity of the silicon will further insure this faithful relationship between the junction temperature and between the cause of temperature changes.

In the manufacture of the semiconductor element of FIGURES 2 and 3, the basic N-type wafer preferably will not have too high a resistivity, since this may cause the depletion layer of the junction to become too wide and would not follow the temperature variations of the irradiated surface throughout the volume of the junction. Thus, for best results, the impurity density in the N-type wafer should not fall below $10^{15}$ to $10^{16}$ per $cm.^3$.

The wafer 10 of FIGURE 4 is then soldered to a conductive rod 20 by means of a solder layer 21 which could be of any suitable material. The rod 20 then extends into any suitable header and terminal box, schematically illustrated as box 22, and is surrounded by an insulation sleeve or coating 23.

A conductive lead 24 (FIGURES 4 and 5) then extends along the exterior of insulation coating 23, and is soldered to the edge region of wafer 10 which is of the P-type, as illustrated in FIGURE 3. Both the conductive rod 20 and lead 24 extend into the header and terminal box where they are connected to some suitable source 30 of constant current and to a suitable indicating instrument 31 which can appropriately indicate the forward voltage across the junction in wafer 10 and thus the temperature of layer 15, in turn, related to the infrared radiation intensity falling upon layer 15.

If desired, an additional outer insulation layer may surround the lead 24 and insulation coating 23 to further mechanically reinforce the structure. The element can, of course, have any desired length so that the detector may be inserted into normally crowded environments, or the like, as when used for searching for hot spots in electronic gear.

Note that the rod 20 may have any desired shape, even though it is shown as simply a straight rod so that it could be easily inserted into otherwise inaccessible locations. Moreover, it is possible that the conductor 20 along with the other equipment thereon may be of a flexible nature so that the detector may be bent to any desired configuration.

The total receiving area of the detector can, of course, be of any desired size, and could, for example, be of 1 $mm.^2$ which would be capable of relatively simple production techniques.

The minimum detectable power for such a device will be determined by the noise generated in the detecting device, which would, for example, be of the order of $10^{-7}$ to $10^{-8}$ watts for detectors having a 1 $mm.^2$ receiving area and a current density of 1 ampere per square cm. This sensitivity will be satisfactory for most purposes, although suitable modifications in design can lower this detection limit by 2 to 3 orders of magnitude. For example, the minimum detected power could be decreased by increasing the thermal resistance to the wafer and by decreasing its size.

Figure 6:
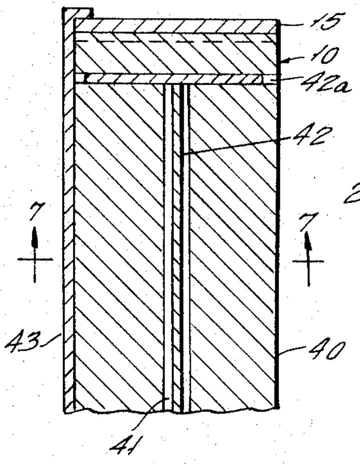
FIGURE 6 is a cross-sectional view similar to FIGURE 4 of a second embodiment of the invention for infrared measuring purposes.
Figure 5:
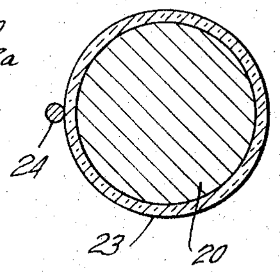
FIGURE 5 is a cross-sectional view of FIGURE 4 when taken across the lines 5—5 in FIGURE 4.
Figure 7:
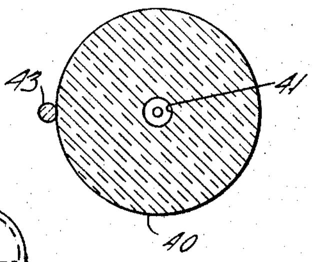
FIGURE 7 is a cross-sectional view of FIGURE 6 taken across the lines 7—7 in FIGURE 6.

One novel manner in which the minimum detection power can be improved is illustrated in the embodiment of FIGURES 6 and 7. FIGURES 6 and 7 will be noted to correspond to FIGURES 4 and 5 insofar as their connection to a header is concerned.

However, the arrangement of FIGURES 6 and 7 permits the semiconductor wafer 10 to be made extremely thin with connections to its N and P regions being made by means of very thin wires of the order of 100 microns in diameter. More specifically, in FIGURE 6, the main support for wafer 10 is comprised of an insulation rod 40 having an opening 41 therein. A terminal lead 42 which extends into the header box of FIGURE 4 passes through the opening 41 and terminates upon a solder wafer 42*a* which is connected to the N-type region of wafer 10 and to insulating rod 40. Soldering to the latter is with the aid of a fired-on metal layer on its face.

The second lead for the device is comprised of the lead 43 which extends upwardly and over the surface of rod 40 and terminates upon the gold layer 15 which also serves as a contact to the P-type region of the wafer. This lead is insulated along its length, excepting the terminals.

With this type of structure, the resulting device is very robust, although it is extremely sensitive in operation.

The present invention was illustrated in the foregoing figures for application to an infrared type detector. In such detectors the temperature increase caused by the forward current flow is of little direct interest. When, however, the junction detector of the present invention is used to measure flow velocity, it is necessary that the forward current through the junction establish a temperature increase above ambient in the detector. The fluid flow over the detector surface will then operate to cool the detector whereby the decrease in temperature will be a function of flow velocity for a given fluid. This decrease in temperature is, of course, detected by an increase in the forward voltage drop so that flow velocity will be measured and indicated on a suitably calibrated instrument.

Where the device of the invention is applied to flow measurement techniques, it will be clear that the gold layer such as the gold layer 15 of FIGURES 4 and 6 will not be needed. Moreover, where the element opposes gas or fluid flow, the semiconductor surface can be hemispherical to avoid turbulence in the measured flow.

Figure 8:
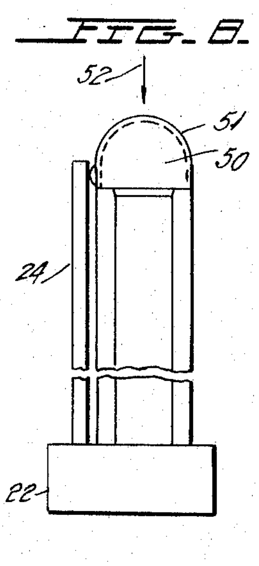
FIGURE 8 shows a side plan view of an embodiment of the invention for measurement of the velocity of a fluid.

A typical embodiment of the invention for the measurement of fluid flow is illustrated in FIGURE 8 wherein components similar to those of FIGURE 4 have been given similar identifying numerals. Thus, in FIGURE 8, the wafer 10 has been replaced by a hemispherical wafer 50 which may have an N-type body and a P-type surface layer 51 diffused therein. The P-type surface layer 51 is suitably connected to the lead 24, as described previously.

The flow direction in the embodiment of FIGURE 8 is in the direction of the arrow 52 whereby flow, at least in the region of the wafer 50, will be substantially streamlined.

Clearly, the forward current through the device will be sufficient to cause the normal temperature of the junction to be greater than that of the ambient whereby the flow of fluid over the junction will cool it down from this temperature, the decrease in temperature being related to the fluid velocity.

Figure 9:
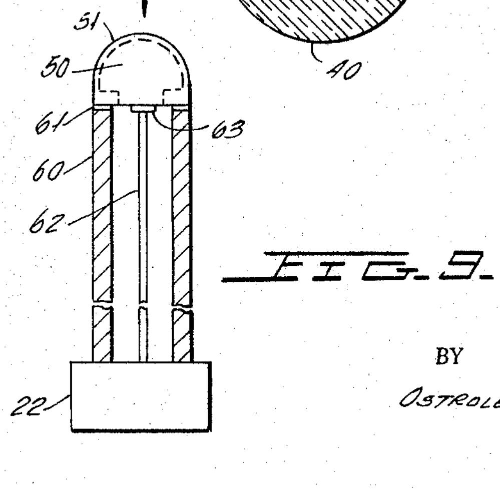
FIGURE 9 is a partial cross-sectional view of an embodiment of the invention for measurement of fluid velocity.

FIGURE 9 shows a further embodiment of the invention for flow measurement purposes where one lead has to be prevented from contact with liquid and wherein the hemispherical wafer 50 is formed in the manner described in FIGURE 8. In FIGURE 9, however, a hollow cylindrical conductor 60 extends from the terminal box 22 and is directly connected to the periphery of the P-type surface 51 of the wafer. Note that in FIGURE 9, the P-type region may be extended inwardly at the base of the wafer. The connection between conductor 60 and wafer 50 may be made through the use of a suitable annular solder ring 61.

Central lead 52 then extends centrally of conductor 60 and is insulated therefrom and connected to the N-type material portion of wafer 50, for example, by the solder disc 63.

Although this invention has been described with respect to its preferred embodiments, it should be understood that many variations and modifications will now be obvious to those skilled in the art, and it is preferred therefore that the scope of the invention be limited not by the specific disclosure herein, but only by the appended claims.

The embodiments of the invention in which an exclusive privilege or property is claimed are defined as follows:

1. A semiconductor detector comprising a wafer of semiconductor material having a junction therein; the upper surface of said wafer being exposed to the temperature of the external environment; a source of constant current connected in series with said junction for passing a constant forward current through said junction, and measuring means for measuring the forward voltage drop across said junction; said forward current through said junction heating said wafer to a temperature in excess of the temperature of the environment of said detector; the flow of fluid past said wafer cooling said wafer by an amount dependent upon the rate of flow of said fluid whereby said detector measures fluid velocity; said wafer having a hemispherical upper surface.

2. The device substantially as set forth in claim 1 wherein said junction is of the order of one micron from said upper surface of said wafer.

3. A semiconductor detector comprising a wafer of semiconductor material having a junction therein; the upper surface of said wafer being exposed to the temperature of the external environment; a source of constant current connected in series with said junction for passing a constant forward current through said junction; and measuring means for measuring the forward voltage drop across said junction; an elongated conductive mounting structure for said wafer; said conductive mounting structure being connected to the lower surface of said wafer and having a cross-sectional area substantially equal to the area of said wafer.

4. The device substantially as set forth in claim 3 wherein said junction is of the order of one micron from said upper surface of said wafer; said wafer having an area of the order of 1 mm.$^2$.

References Cited by the Examiner

UNITED STATES PATENTS

| | | | |
|---|---|---|---|
| 2,504,628 | 4/1950 | Benzer. | |
| 2,870,305 | 1/1959 | Ling | 73—204 X |
| 2,935,711 | 5/1960 | Christensen | 73—355 X |
| 3,092,998 | 6/1963 | Barton | 73—362 |
| 3,142,987 | 8/1964 | Dowling et al. | 73—362 |

FOREIGN PATENTS

| | | |
|---|---|---|
| 248,710 | 12/1963 | Australia. |

LOUIS R. PRINCE, *Primary Examiner.*

D. McGIEHAN, *Assistant Examiner.*